United States Patent [19]

Schade, Jr.

[11] 3,852,679

[45] Dec. 3, 1974

[54] CURRENT MIRROR AMPLIFIERS

[75] Inventor: Otto Heinrich Schade, Jr., N. Caldwell, N.J.

[73] Assignee: RCA Corporation, New York, N.Y.

[22] Filed: Dec. 26, 1972

[21] Appl. No.: 318,646

[52] U.S. Cl. .................. 330/30 D, 330/18, 330/35, 330/24

[51] Int. Cl. .................. H03f 3/68

[58] Field of Search .......... 330/30 D, 38 M, 35, 69

[56] References Cited

UNITED STATES PATENTS

| | | | |
|---|---|---|---|
| 3,641,448 | 2/1972 | Steckler | 330/38 M X |
| 3,717,777 | 2/1973 | Cecil | 330/30 D X |
| 3,737,796 | 6/1973 | Legler | 330/30 D X |
| 3,737,800 | 6/1973 | Russell et al. | 330/30 D X |
| 3,760,288 | 9/1973 | Leonard | 330/38 M X |

*Primary Examiner*—Nathan Kaufman

*Attorney, Agent, or Firm*—H. Christoffersen; S. Cohen

[57] ABSTRACT

A current mirror amplifier for combining the output currents of an MOS source-coupled differential amplifier comprises first and second bipolar transistors having parallelled base-emitter circuits including emitter degenerative resistors. A similar resistor judicially placed in the collector circuit of one of these bipolar transistors ensures that the differential amplifier will not exhibit an offset potential between its input terminals caused by its component devices being subjected to different conditions of quiescent drain biasing when the differential amplifier supplies its combined output currents by direct coupling to a subsequent grounded-emitter amplifier stage.

12 Claims, 3 Drawing Figures

CURRENT MIRROR AMPLIFIERS

BACKGROUND OF THE INVENTION

A current mirror amplifier is a current amplifier with a current gain of minus unity and is commonly used in integrated circuitry. Input current variations applied to its input circuit, which customarily exhibits relatively low impedance, will cause output current variations equal and opposite thereto in its output circuit, which customarily exhibits a relatively high impedance. The current mirror amplifier typically includes a pair of transistors having similar base-emitter circuits biased in common by a negative feedback circuit coupling the collector electrode of the first transistor to its base electrode. The negative feedback circuit regulates the collector current of the first transistor to be substantially the same as an applied input current. Because of the similarity of the conditions imposed upon their base-emitter junctions, the collector currents of the transistors are substantially equal. The second transistor thus supplies an output current from its collector electrode substantially equal and opposite to the input current accepted by the first transistor collector electrode. To better assure the equality of the collector currents of the pair of transistors, equal value emitter degenerative resistors are conventionally used. Current mirror amplifiers are often employed as active loads for differential amplifier transistors and in that role constructively combine the differential amplifier output currents.

SUMMARY OF THE INVENTION

The present invention is embodied in a current mirror amplifier which includes first and second transistors. The base electrodes are coupled to an input terminal of the amplifier, which input terminal is arranged to accept a first input current applied thereto. The first and second transistors have emitter electrodes respectively connected by first and second degenerative resistive elements to a common terminal of the amplifier. The first and second transistors have collector electrodes, direct current conductively coupled respectively to the input terminal and an output terminal of the amplifier. An auxiliary terminal is arranged to accept a second input current related to the first input current. Means are provided for direct current conductively coupling the auxiliary and output terminals of the amplifier together and for maintaining in response to the second input current a quiescent offset potential across itself, which quiescent offset potential is substantially equal to the difference in quiescent potentials appearing at the input and the output terminals.

DETAILED DESCRIPTION

Figure 1:
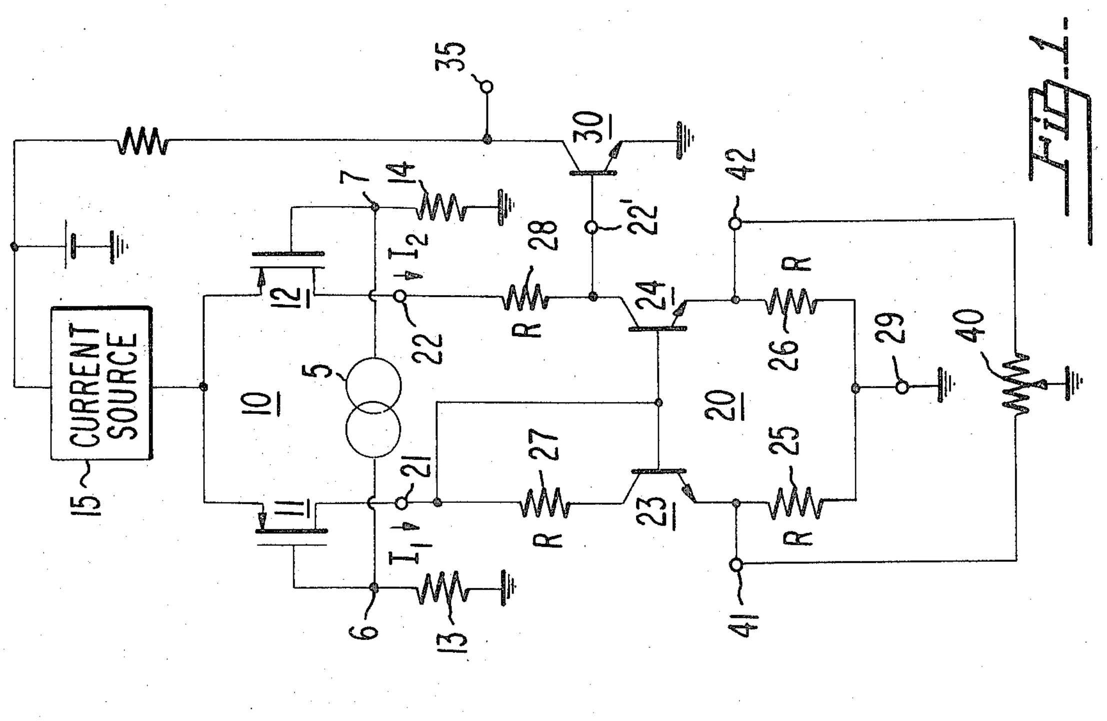

FIG. 1 shows a configuration in which the present invention may be used to good advantage. A source 5 of input signals applied to a differential amplifier 10 causes output currents with equal and opposite current variations to be supplied to a current mirror amplifier 20 which constructively combines the current variations for application to a subsequent grounded-emitter transistor amplifier 30. The current mirror 20 should withdraw quiescent currents I, $I_2$ which are as nearly equal as possible from the differential amplifier 10 to avoid applying different biasing conditions to its component transistors 11, 12. Such different biasing conditions would cause the transconductance of the transistors 11, 12 to differ from each other and so result in an undesirable potential offset between input terminals 6, 7 of the differential amplifier 10.

The transistors in the differential amplifier 10 are shown as being PMOS field-effect transistors 11, 12 which are preferred because of their high input impedance compared to bipolar devices. In general, it is more critical that the amplitudes of the quiescent currents $I_1$, $I_2$ supplied to the current mirror amplifier be equal when the differential amplifier 10 uses source-coupled PMOS transistors, as shown, than when it uses emitter-coupled PNP bipolar transistors. The reason is that the MOS transistors have a substantially lower transconductance than bipolar transistor at most current levels, so a slight mismatch of quiescent output currents I, $I_2$ causes a higher differential input offset voltage in differential amplifier using MOS transistors than in one using bipolar transistors.

To provide simple input bias circuitry and to facilitate direct coupling from signal sources referred to ground reference potential, the gate electrodes of the transistors 11, 12 are quiescently biased to ground reference potential by resistors 13, 14. The interconnected source electrodes of transistors 11, 12 are supplied quiescent source current from a current source 15. Since the gate electrodes of PMOS transistors 11, 12 are biased near the drain supply potential, the resultant restricted drain-to-source potential places them in a region where their output resistance and transconductance are substantially reduced as device saturation is approached. This also increases differential input voltage offset between the gate electrodes of transistors 11, 12 should their drain currents $I_1$, $I_2$ be mismatched. Too, the NPN transistors 23, 24 in the current mirror amplifier are operated at collector-emitter potentials of only about one base-emitter offset potential ($1V_{BE}$, about 650 millivolts), which is not far removed from collector saturation potential (say, 100 to 200 millivolts). As temperature increases slightly, the $1V_{BE}$ collector-to-emitter potential falls, approaching a rising saturation potential more closely. This tends to cause the current mirror amplifier 20 to withdraw less well balanced currents $I_1$, $I_2$ from the drain electrodes of transistors 11, 12.

The current mirror amplifier 20 essentially comprises transistors 23, 24 and resistors 25, 26, 27, 28. The collector currents of transistors 23 and 24 are substantially equal, presuming these transistors to be of substantially identical construction and to share a common thermal environment, so long as their base-emitter circuits are alike. If the resistances of emitter resistors (25, 26) of transistors 23, 24 are of equal value R or are both 0, their base and emitter currents will be substantially alike, since their base electrodes are at the same potential and since their emitter electrodes are coupled through resistors of equal value to a common terminal 29 which is at ground reference potential. Neglecting the customarily much smaller combined base currents of transistors 23, 24, their equal collector currents would be supplied via terminals 21, 22.

Early prior art current mirror amplifier configurations similar to current mirror amplifier 20 but having direct connections instead of resistors 25, 26, 27, 28 were frequently found to have imbalances in the collector currents of their component transistors due to slightly different transconductances thereof. This imbalance was largely cured in later prior art current mirror amplifier configurations which included emitter degeneration resistors such as 25, 26 with equal resistance R. However, the present inventor has now discovered that these emitter degeneration resistors 25, 26 (in the absence of resistor 28 of the present circuit) introduce a problem when the output terminal 22′ of the current amplifier is used to supply output signal and base bias to the transistor 30.

In brief, in the absence of resistor 28, point 22 is point 22′, that is, they are at the same potential. The value of this potential is $V_{BE30}$ as the emitter of transistor 30 is tied to ground. However, point 22 is at a potential $V_{BE23}$ (in view of the feedback connection from the base of transistor 23 to point 21) plus the voltage $V_{25}$ across resistor 25. Since $V_{BE23} \approx V_{BE23}$, and since $V_{25}$ is a substantial value, this means that $V_{21}$ is substantially different than $V_{22}$. The MOS transistors 11, 12 will have unequal quiescent drain-to-source potentials, affecting their relative transconductances and introducing an undesirable offset in quiescent offset potential between terminals 6 and 7.

To provide similar quiescent bias conditions on the PMOS transistors 11, 12 the quiescent potentials at input terminals 21, 22 of the current mirror amplifier 20 should be equal. The potential at input terminal 21 is regulated by the negative feedback connection in the collector to base circuit of transistor 23 to be one base-emitter offset potential, $V_{BE23}$, above the potential at the emitter electrode of transistor 23. This $V_{BE}$ is that required for the transistor 23 to draw a collector current substantially equal to $I_1$, the base currents of transistors 23 and 24 usually being a negligibly small fraction of $I_1$.

The quiescent emitter current $I_{E23}$ of transistor 23, flowing through the emitter resistor 25, produces a quiescent potential drop $I_{E23}$ R thereacross. The quiescent potential at input terminal 21 is ($V_{BE23} + I_{E23}$ R) as referred to the common terminal 29 of the current mirror amplifier 20. The quiescent potential at the output terminal 22′ is held by the base-emitter clamping action of transistor 30 at a base-emitter offset potential $V_{BE30}$. $V_{BE30}$ and $V_{BE23}$ are substantially equal if their currents are within the same order of magnitude.

The present invention resides in part in the discovery, as indicated in the analysis above, of why the prior art circuit (the one with degenerative resistors 25 and 26 and without the resistor 28) performed less well than one would anticipate and of what shortcomings caused the offset between quiescent input potentials at terminals 6, 7 of the differential amplifier 10. The source of the performance deficiency can be traced to the unequal quiescent potentials at terminals 21 and 22 causing dissimilar bias conditions on the MOS transistors 11, 12.

To permit the potential at input terminal 22 to equal the potential at terminal 21 ($V_{BE23} + I_{E23}$ R) while the base electrode potential of transistor 30 substantially equals $V_{BE23}$, there must be a means to provide a potential drop $I_{E23}$R between terminals 22 and 22′.

Since the quiescent base current of transistor 24 is presumed to be a negligible fraction of the current $I_1$, $I_{E23}$ is substantially equal to $I_1$. The potential drop between terminals 22 and 22′ therefore should be equal to $I_1$R. Since $I_1$ should equal $I_2$, the potential drop between terminals 22 and 22′, which will be caused by $I_2$, should equal $I_2$R. This condition is met by placing a resistor 28 also of value R between terminals 22 and 22′.

In the absence of resistor 27, the collector voltage of transistor 24 will be slightly less positive than that of transistor 23, which will cause the transconductance of these transistors to be slightly different. This will adversely affect the balance of the drain currents of PMOS transistors 11, 12, causing an undesirable offset between their gate electrode potentials. A resistance 27 of value R is a circuit refinement which will equalize the collector voltages of the transistors 23, 24.

To more accurately adjust the relative quiescent drain currents of transistors 11, 12, one may use a potentiometer 40 connected per the prior art as shown. The resistance of the potentiometer is greater than R between each of its terminals 41, 42 and ground reference potential when its slider is in intermediate position between the terminals 41, 42. The potentiometer can be set to correct slight differences in the resistances of resistive elements 25, 26.

A direct-coupled feedback network (not shown) may connect the output terminal 35 of the collector electrode of the common emitter transistor amplifier 30 to the gate electrode of one of the PMOS transistors 11, 12 to further stabilize the operating point of transistor 30, if so desired.

Figure 2:
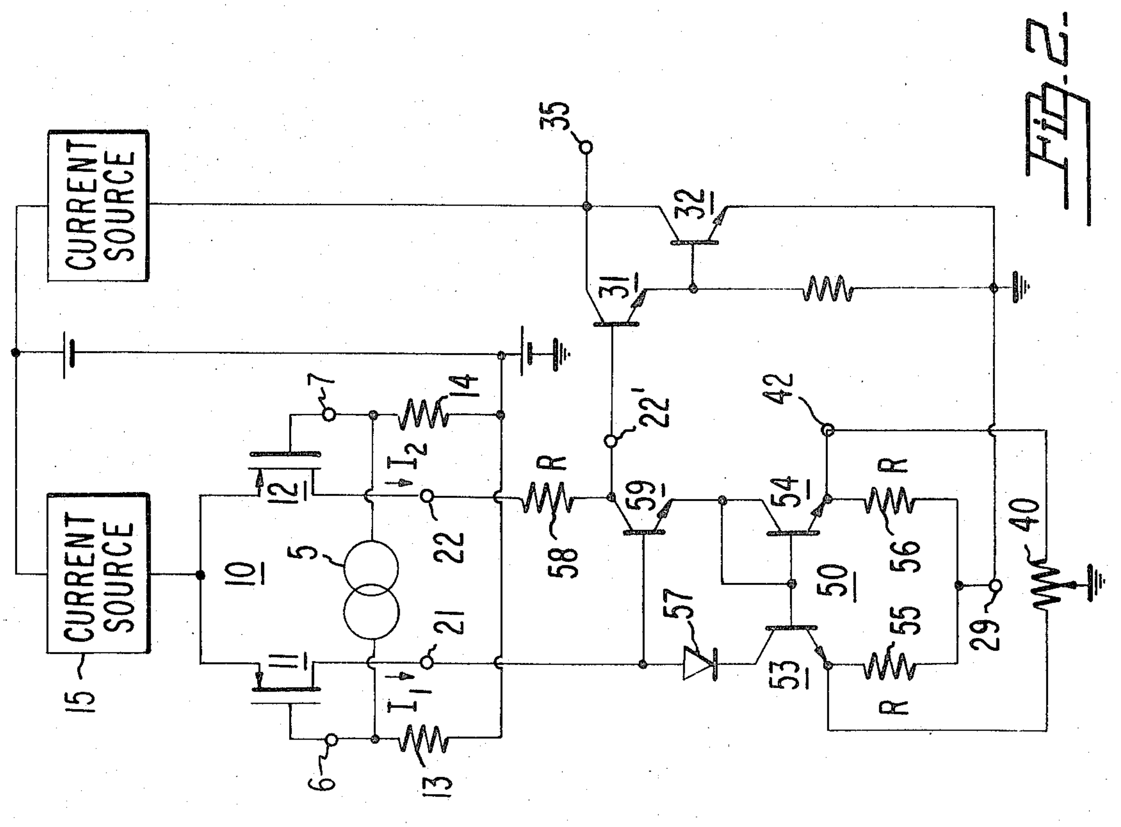
FIGS. 1, 2 and 3 are each a schematic diagram of a differential amplifier provided with a current mirror amplifier active load and followed in direct-coupled cascade by a ground-emitter transistor amplifier, wherein each mirror amplifier is of an improved type embodying the present invention and facilitating the direct coupling of the differential amplifier and grounded-emitter transistor amplifier.

FIG. 2 shows the present invention used with a current mirror amplifier 50 of different type than current mirror amplifier 20. In current mirror amplifier 50, the similar base-emitter circuit connections of similar transistors 53 and 54 make their quiescent collector currents substantially equal. The collector current of transistor 59 is substantially equal to its emitter current, presuming its base current negligibly small compared to its collector current, which emitter current is preponderantly the collector current of transistor 54. The quiescent collector currents of transistors 53, 54 are preponderant portions of quiescent current $I_1$, $I_2$. Terminal 22′ is held by the base-emitter clamping action of transistors 31 and 32 to be at a $2V_{BE}$ potential equal to $V_{BE31}$ plus $V_{BE32}$, where $V_{BE31}$ and $V_{BE32}$ are the base-emitter offset potentials of transistors 31 and 32, respectively. The collector-to-base negative feedback connection of transistor 53 regulates the potential drop from input terminal 21 to its emitter electrode to be a $2V_{BE}$ potential equal to $V_{BE53} + V_{BE59}$, where $V_{BE53}$ and $V_{BE59}$ are the base-emitter offset potentials of transistors 53 and 59, respectively. This regulation action also makes the collector and emitter currents of transistor 53 substantially equal to $I_1$, presuming the base currents of the transistors 53, 54, 59 negligibly small compared to their collector currents.

A potential drop $I_1$R is developed across resistor 55, so terminal 21 is at a $2V_{BE} + I_1R$ potential. To provide similar potentials at terminals 21 and 22, terminal 22 must be at $2V_{BE} + I_1R$ potential. Since $I_1$ is supposed to equal $I_2$ because of the biasing conditions of differential amplifier 10, the potential supposed to be on terminal 22 may be expressed as $2V_{BE} + I_2R$. Since the potential on terminal 22' is $2V_{BE}$, the current $I_2$ flowing through resistor 58 must provide a potential drop $I_2R$. Therefore, resistor 58 should have a resistance R.

The semiconductor diode 57 provides for equal collector voltages to transistors 53 and 54, each being offset from the potential at terminal 21 by the potential developed across a forward biased semiconductor junction. The diode 57 may comprise a transistor with its collector and base electrodes joined thereby providing one electrode of the diode and with its emitter electrode providing the other electrode of the diode. Alternatively, the diode 57 may simply comprise an auxiliary junction diffused into the collector electrode of transistor 53.

Figure 3:
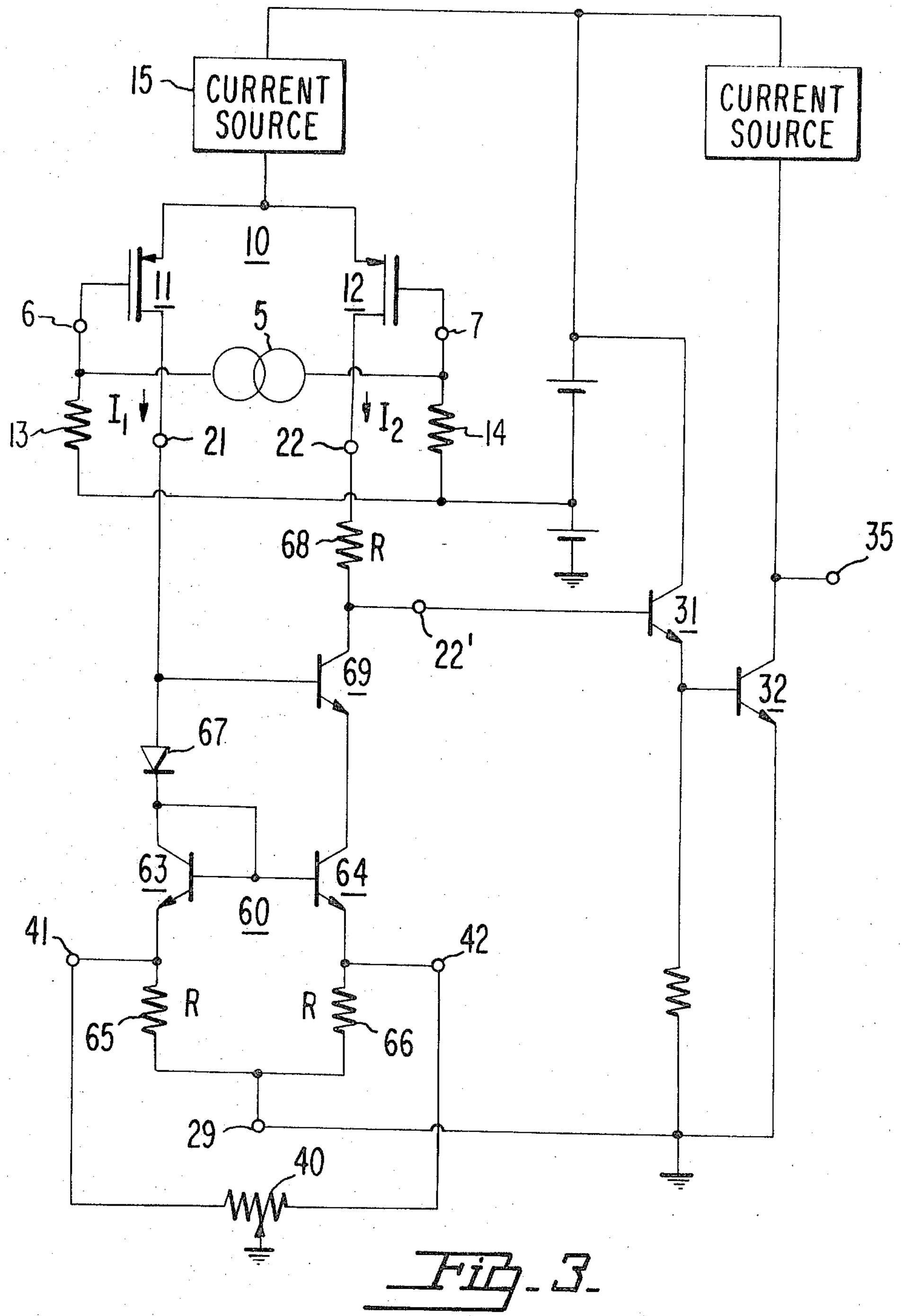

FIG. 3 shows the present invention used with a current mirror amplifier 60. Because of their base-emitter circuits being the same, the collector currents of transistors 63 and 64 are substantially equal. The collector-to-base negative feedback of transistor 63 regulates its collector current to be substantially equal to $I_1$ as supplied via diode 67, the base current of transistor 69 being presumed comparatively negligible. The collector current of transistor 69 is substantially the same as its emitter current supplied primiarily by the collector current of transistor 64. Therefore, the collector current of transistor 69 is substantially equal to $I_1$.

Terminal 22' is held at a $2V_{BE}$ potential by the base-emitter clamping action of transistors 31, 32. The current $I_1$ flows primarily through diode 67, the collector-to-emitter path of transistor 63 and the resistance 65. There is a $1V_{BE}$ drop across the forward-biased diode 67. The regulating action of its collector-to-base connection maintains the collector of transistor 63 at a potential $1V_{BE}$ above its emitter electrode. The current $I_1$ causes a potential drop $I_1R$ in the resistor 65. Terminal 21 is thus at a potential of $2V_{BE} + I_1R$. The differential amplifier 10 should maintain currents $I_1$ and $I_2$ equal. The quiescent potential at terminal 22 should be $2V_{BE} + I_2R$ so that the transistors 11 and 12 share similar quiescent bias conditions. The potential drop across resistor 68 caused by the current $I_2$ should equal $I_2R$; therefore, the resistance of resistor 68 should equal R.

The diode 67 may be constructed in either of the alternatives described in connection with diode 57.

While the application of the present invention to three known types of current mirror amplifier has been described it is apparent that it may be used in other types of current mirror amplifier which use transistors with degenerated signal gain.

What is claimed is:

1. A differential amplifier comprising:

first and second input terminals for application of first and second input currents, respectively, with quiescent components being proportionally related in a ratio of *m* to *l*, *m* being a positive number;

a common terminal;

an output terminal;

first and second and third transistors of the same conductivity type, having respective base and emitter and collector electrodes, the transconductance versus base-emitter potential characteristics of said first and said second transistors being proportionally related in a ratio of *m* to *l*;

first and second and third direct coupling means having substantially identical potential translation characteristics, said first direct coupling means being the sole means for direct coupling said first input terminal to said first transistor base electrode, said second direct coupling means being the sole means for direct coupling said first input terminal to said second transistor base electrode;

means direct current conductively coupling said first transistor collector electrode to said first input terminal;

first and second and third resistive elements having respective resistances proportionally related to each other in a ratio of *l* to *m* to *m*, said first resistive element connecting said first transistor emitter electrode to said common terminal for conducting the entire emitter current of said first transistor, said second resistive element connecting said second transistor emitter electrode to said common terminal for conducting the entire emitter current of said second transistor, said third resistive element being connected at a first of its ends to said second input terminal and being connected at a second of its ends to said second transistor collector electrode such that the entire collector current of said second transistor flows through said third resistive element; and means for connecting said third transistor as a common-emitter amplifier including a direct connection of its emitter electrode to said common terminal, a connection of its collector electrode to said output terminal and direct coupling of the second end of said third resistive element to said third transistor base electrode by said third direct coupling means, said differential amplifier being operative under the aforeclaimed input current conditions to maintain substantially equal quiescent potentials at its said first and said second input terminals.

2. A differential amplifier comprising:

a common terminal;

first and second input terminals arranged for application of first and second input currents, respectively;

an output terminal;

first and second and third transistors each having a base and an emitter electrode with a semiconductor junction therebetween and each having a collector electrode, said third transistor emitter electrode being directly connected to said common terminal;

first, second and third resistive elements, each having first and second ends, said second and said third resistive elements having substantially equal resistances, said first and said second resistive elements having their respective first ends directly connected respectively to said first transistor emitter electrode and to said second transistor emitter electrode and having their second ends directly connected to said common terminal;

means for direct current conductively coupling said first transistor collector electrode to said first input terminal;

means for direct current conductively coupling said second transistor collector electrode to said second input terminal via a path passing through said third resistor included therewithin, the first end of said third resistor being connected to said second input terminal;

first direct coupling means connecting said first input terminal to said first transistor base electrode thereby to regulate the potential between said first input terminal and said first transistor emitter electrode to be substantially equal to an integral multiple of offset potential developed across said first transistor semiconductor junction in response to said first input current as applied to said first input terminal;

means to provide the same potential to said second transistor base electrode as to said first transistor base electrode;

second direct coupling means, being of like type to said first direct coupling means and connecting the second end of said third resistor to said third transistor base electrode; and further means for connecting said third transistor in common-emitter amplifier configuration including a connection of said output terminal to its collector electrode.

3. A differential amplifier as claimed in claim 2 wherein said first and second resistive elements are of substantially equal resistance, having in combination therewith:

first and second semiconductor amplifier devices of a complementary conductivity type to said first and said second transistors, each of which said amplifier devices has an input electrode, said first and said second amplifier devices having output electrodes respectively connected to said first and said second input terminals;

means for providing operating currents to the common electrodes of said first and said second semiconductor amplifier devices; and means for providing similar quiescent bias conditions to each of said input electrodes of said first and said second semiconductor amplifier devices as referred to said common terminal, thereby conditioning said first and said second semiconductor amplifier devices to provide said first input current and said second input current respectively from their respective output electrodes which receive substantially equal quiescent potentials in return.

4. In a differential amplifier comprising first and second transistors, each having a base and an emitter and a collector electrode, a first and a second input terminal, means for direct current conductively coupling said first input terminal to said first transistor collector electrode, means for direct current conductively coupling said second input terminal to said second transistor collector electrode, a common terminal, first and second emitter resistances of substantially equal resistance value R respectively connecting separate ones of said emitter electrodes of said first and said second transistors each to said common terminal, substantially identical means for direct coupling each of said base electrodes of said first and said second transistors to said first input terminal, said means for direct coupling said first transistor base electrode to said first terminal in combination with said first transistor and with said means for direct current conductively coupling said first terminal to said first transistor collector electrode forming a negative feedback loop for regulating the potential between said input terminal and said first transistor emitter electrode to a first value, and output load means having an input port connected between said second transistor collector electrode and said common terminal and exhibiting regulatory action to maintain the potential across its input port at a second value substantially equal to but somewhat smaller than said first value, the improvement comprising:

a first collector resistance of said resistance value R, included in said means for direct current conductively coupling said second input terminal to said second transistor collector electrode and connected between said second input terminal and said second transistor collector electrode.

5. In an improved differential amplifier as claimed in claim 4, the refinement comprising:

a second collector resistance of said resistance value R included in said means for direct current conductively coupling said first transistor collector electrode to said first input terminal and connected between said first input terminal and said first transistor collector electrode.

6. An amplifier including the improved differential amplifier claimed in claim 4, having:

third and fourth transistors, each having an input electrode and an output electrode and a common electrode, and means for connecting said third and said fourth transistors in a further differential amplifier configuration with their common electrodes coupled to each other and to said common terminal, their input electrodes adapted to receive input signals and their output electrodes respectively connected to said first and said second input terminals; and having included within said output load means:

a fifth transistor, which is of the same conductivity type as said first and said second transistors and has a base and an emitter and a collector electrode and means connecting said fifth transistor in a common-emitter amplifier configuration including the direct coupling of its base electrode to said output terminal and the direct connection of its emitter electrode to said common terminal.

7. In a differential amplifier comprising first and second and a third and a fourth and fifth transistors each having a base and an emitter and a collector electrode, a first input terminal direct coupled to said third transistor base electrode, means for direct current conductively coupling said first transistor collector electrode to said first input terminal, a second input terminal direct current conductively coupled to said third transistor collector electrode, a common terminal, an output terminal directly connected to said fifth transistor collector electrode, said second transistor collector electrode being direct current conductively coupled to said third transistor emitter electrode, first and second emitter resistances of substantially equal resistance value R respectively connecting separate ones of said emitter electrodes of said first and said second transistors each to said common terminal, substantially identical means direct coupling each of the base electrodes of said first and said second transistors to said third transistor emitter electrode, and means for connecting the fourth and fifth transistors as a direct coupled amplifier cascade configuration with said fourth transistor base electrode connected to said third transistor collector electrode and with said fifth transistor base electrode connected to said fourth transistor emitter electrode and with said fifth transistor emitter electrode directly connected to said common terminal, the improvement comprising:

a first collector resistance of said resistance value R included in said means for direct current conductively coupling said second input terminal and said third transistor collector electrode and connected between said second input terminal and said fourth transistor base electrode.

8. In an improved differential amplifier as claimed in claim 7, the refinement comprising:

a semiconductor diode included within said means for direct current conductively coupling said first transistor collector electrode to said first input terminal.

9. An amplifier including the improved differential amplifier claimed in claim 8 and having:

sixth and seventh transistors, each having an input electrode and an output electrode and a common electrode, and means for connecting said sixth and said seventh transistors in a further differential amplifier configuration with their common electrodes coupled to each other and to said common terminal, their input electrodes adapted to receive input signals and their output electrodes respectively connected to said first and said second input terminals to provide respectively first and second currents responsive to said input signals and to receive substantially equal quiescent potentials in return.

10. In a differential amplifier comprising first and second and third transistors each having a base and an emitter and a collector electrode, a first input terminal direct coupled to said third transistor base electrode, means for direct current conductively coupling said first transistor collector electrode to said first input terminal, means direct current conductively coupling said second transistor collector electrode to said third transistor emitter electrode, a second input terminal, means direct current conductively coupling said third transistor collector electrode to said second input terminal, a common terminal, first and second emitter resistances of substantially equal resistance value R respectively connecting separate ones of said emitter electrodes of said first and said second transistors each to said common terminal, substantially identical means direct coupling each of said base electrodes of said first and said second transistors to said first input terminal, said means for direct current conductively coupling said first transistor collector electrode to said first input terminal in combination with said first transistor and with said means direct coupling said first transistor base electrode to said first input terminal forming a negative feedback loop for regulating the potential between said input terminal and said first transistor emitter electrode to a first value, output load means having an input port connected between said third transistor collector electrode and said common terminal and exhibiting regulatory action to maintain the potential across its input port at a second value substantially equal to but somewhat smaller than said first value, the improvement comprising:

a first collector resistance of said resistance value R included in said means for direct current conductively coupling said third transstor collector electrode to said second input terminal and connected between said second input terminal and said third transistor collector electrode.

11. An amplifier, including the improved differential amplifier claimed in claim 10 and having:

fourth and fifth transistors, each having an input electrode and an output electrode and a common electrode, and means for connecting said fourth and said fifth transistors in a further differential amplifier configuration with their common electrodes coupled to each other and to said common terminal, their input electrodes adapted to receive input signals and their output electrodes respectively connected to separate ones of said first and said second input terminals.

12. A current mirror amplifier comprising:

an input, a common and an output terminals;

a first, a second and a third transistors each having a base electrode, an emitter electrode and a collector electrode;

means for similarly direct current conductively coupling said first and said second transistor emitter electrodes to said common terminal;

means for similarly direct coupling said third transistor emitter electrode to said base electrodes of said first and said second transistors;

means for direct current conductively coupling said second transistor collector electrode to said third transistor emitter electrode;

means for maintaining said third transistor base electrode at substantially the same potential as appears at said input terminal;

means for direct current conductively coupling said third transistor collector electrode to said output terminal and a semiconductor diode providing direct current conductive connection of said input terminal and said first transistor collector electrode.

* * * * *

UNITED STATES PATENT OFFICE
CERTIFICATE OF CORRECTION

PATENT NO. : 3,852,679

DATED : December 3, 1974

INVENTOR(S) : Otto Heinrich Schade, Jr.

It is certified that error appears in the above-identified patent and that said Letters Patent are hereby corrected as shown below:

Column 5, line 57, italic el should be the numeral one.
Column 5, line 65, italic el should be the numeral one.
Column 6, line 12, italic el should be the numeral one.
Column 8, line 42, delete "a" (both occurrences).
Column 10, line 11, "transstor" should read ---transistor---.

Signed and sealed this 29th day of April 1975.

(SEAL)
Attest:

RUTH C. MASON
Attesting Officer

C. MARSHALL DANN
Commissioner of Patents and Trademarks